(12) United States Patent
Tandon et al.

(10) Patent No.: US 8,398,772 B1
(45) Date of Patent: Mar. 19, 2013

(54) METHOD AND STRUCTURE FOR PROCESSING THIN FILM PV CELLS WITH IMPROVED TEMPERATURE UNIFORMITY

(75) Inventors: Ashish Tandon, Sunnyvale, CA (US); Robert D. Wieting, Simi Valley, CA (US); Jurg Schmizberger, San Jose, CA (US); Paul Alexander, San Jose, CA (US)

(73) Assignee: Stion Corporation, San Jose, CA (US)

( * ) Notice: Subject to any disclaimer, the term of this patent is extended or adjusted under 35 U.S.C. 154(b) by 140 days.

(21) Appl. No.: 12/858,342

(22) Filed: Aug. 17, 2010

Related U.S. Application Data

(60) Provisional application No. 61/234,983, filed on Aug. 18, 2009.

(51) Int. Cl.
*C23C 16/00* (2006.01)
*C23C 16/455* (2006.01)
*C23C 16/458* (2006.01)

(52) U.S. Cl. ......... 118/724; 118/715; 118/725; 118/729
(58) Field of Classification Search .................. 118/715, 118/724, 725, 729
See application file for complete search history.

(56) References Cited

U.S. PATENT DOCUMENTS

| | | | |
|---|---|---|---|
| 3,520,732 A | 7/1970 | Nakayama et al. | |
| 3,828,722 A * | 8/1974 | Reuter et al. .................... | 18/725 |
| 3,975,211 A | 8/1976 | Shirland | |
| 4,062,038 A | 12/1977 | Cuomo et al. | |
| 4,204,933 A | 5/1980 | Barlow et al. | |
| 4,213,781 A | 7/1980 | Noreika et al. | |
| 4,239,553 A | 12/1980 | Barnett et al. | |
| 4,263,336 A | 4/1981 | Thompson et al. | |
| 4,332,974 A | 6/1982 | Fraas | |
| 4,335,266 A | 6/1982 | Mickelsen et al. | |
| 4,347,436 A | 8/1982 | Fukuda et al. | |
| 4,441,113 A | 4/1984 | Madan | |
| 4,442,310 A | 4/1984 | Carlson et al. | |

(Continued)

FOREIGN PATENT DOCUMENTS

| | | |
|---|---|---|
| AU | 1998/78651 | 2/1999 |
| AU | 2001/40599 A1 | 8/2000 |

(Continued)

OTHER PUBLICATIONS

Baumann, A., et al., Photovoltaic Technology Review, presentation Dec. 6, 2004, 18 pages.

(Continued)

*Primary Examiner* — Jeffrie R Lund
(74) *Attorney, Agent, or Firm* — Kilpatrick Townsend & Stockton LLP

(57) ABSTRACT

An apparatus for reactive thermal treatment of thin film photovoltaic devices includes a furnace tube including an inner wall extended from a first end to a second end. The apparatus further includes a gas supply device coupled to the second end and configured to fill one or more working gases into the furnace tube. Additionally, the apparatus includes a cover configured to seal the furnace tube at the first end and serve as a heat sink for the one or more working gases. Furthermore, the apparatus includes a fixture mechanically attached to the cover. The fixture is configured to load an array of substrates into the furnace tube as the cover seals the furnace tube. Moreover, the apparatus includes a crescent shaped baffle member disposed seamlessly at a lower portion of the inner wall for blocking a convection current of the one or more working gases cooled by the cover.

16 Claims, 9 Drawing Sheets

U.S. PATENT DOCUMENTS

| | | | |
|---|---|---|---|
| 4,461,922 A | 7/1984 | Gay et al. | |
| 4,465,575 A | 8/1984 | Love et al. | |
| 4,471,155 A | 9/1984 | Mohr et al. | |
| 4,472,622 A * | 9/1984 | Satoh et al. | 219/390 |
| 4,499,658 A | 2/1985 | Lewis | |
| 4,502,225 A | 3/1985 | Lin | |
| 4,507,181 A | 3/1985 | Nath et al. | |
| 4,517,403 A | 5/1985 | Morel et al. | |
| 4,518,349 A * | 5/1985 | Tressler et al. | 432/11 |
| 4,518,855 A | 5/1985 | Malak | |
| 4,542,255 A | 9/1985 | Tanner et al. | |
| 4,581,108 A | 4/1986 | Kapur et al. | |
| 4,589,194 A | 5/1986 | Roy | |
| 4,598,306 A | 7/1986 | Nath et al. | |
| 4,599,154 A | 7/1986 | Bender et al. | |
| 4,611,091 A | 9/1986 | Choudary et al. | |
| 4,612,411 A | 9/1986 | Wieting et al. | |
| 4,623,601 A | 11/1986 | Lewis et al. | |
| 4,625,070 A | 11/1986 | Berman et al. | |
| 4,638,111 A | 1/1987 | Gay | |
| 4,661,370 A | 4/1987 | Tarrant | |
| 4,663,495 A | 5/1987 | Berman et al. | |
| 4,705,912 A | 11/1987 | Nakashima et al. | |
| 4,724,011 A | 2/1988 | Turner et al. | |
| 4,727,047 A | 2/1988 | Bozler et al. | |
| 4,751,149 A | 6/1988 | Vijayakumar et al. | |
| 4,775,425 A | 10/1988 | Guha et al. | |
| 4,793,283 A | 12/1988 | Sarkozy | |
| 4,798,660 A | 1/1989 | Ermer et al. | |
| 4,816,082 A | 3/1989 | Guha et al. | |
| 4,816,420 A | 3/1989 | Bozler et al. | |
| 4,865,999 A | 9/1989 | Xi et al. | |
| 4,873,118 A | 10/1989 | Elias et al. | |
| 4,911,638 A * | 3/1990 | Bayne et al. | 432/152 |
| 4,915,745 A | 4/1990 | Pollock et al. | |
| 4,950,615 A | 8/1990 | Basol et al. | |
| 4,968,354 A | 11/1990 | Nishiura et al. | |
| 4,996,108 A | 2/1991 | Divigalpitiya et al. | |
| 5,008,062 A | 4/1991 | Anderson et al. | |
| 5,011,565 A | 4/1991 | Dube et al. | |
| 5,028,274 A | 7/1991 | Basol et al. | |
| 5,039,353 A | 8/1991 | Schmitt | |
| 5,045,409 A | 9/1991 | Eberspacher et al. | |
| 5,069,727 A | 12/1991 | Kouzuma et al. | |
| 5,078,803 A | 1/1992 | Pier et al. | |
| 5,125,984 A | 6/1992 | Kruehler et al. | |
| 5,133,809 A | 7/1992 | Sichanugrist et al. | |
| 5,137,835 A | 8/1992 | Karg | |
| 5,154,777 A | 10/1992 | Blackmom et al. | |
| 5,180,686 A | 1/1993 | Banerjee et al. | |
| 5,211,824 A | 5/1993 | Knapp | |
| 5,217,564 A | 6/1993 | Bozler et al. | |
| 5,231,047 A | 7/1993 | Ovshinsky et al. | |
| 5,248,345 A | 9/1993 | Sichanugrist et al. | |
| 5,259,883 A | 11/1993 | Yamabe et al. | |
| 5,261,968 A | 11/1993 | Jordan | |
| 5,298,086 A | 3/1994 | Guha et al. | |
| 5,336,623 A | 8/1994 | Sichanugrist et al. | |
| 5,346,853 A | 9/1994 | Guha et al. | |
| 5,397,401 A | 3/1995 | Toma et al. | |
| 5,399,504 A | 3/1995 | Ohsawa | |
| 5,421,909 A | 6/1995 | Ishikawa et al. | |
| 5,436,204 A | 7/1995 | Albin et al. | |
| 5,445,847 A | 8/1995 | Wada | |
| 5,474,939 A | 12/1995 | Pollock et al. | |
| 5,482,571 A | 1/1996 | Yamada et al. | |
| 5,501,744 A | 3/1996 | Albright et al. | |
| 5,512,107 A | 4/1996 | van den Berg | |
| 5,528,397 A | 6/1996 | Zavracky et al. | |
| 5,536,333 A | 7/1996 | Foote et al. | |
| 5,571,333 A * | 11/1996 | Kanaya | 118/724 |
| 5,578,103 A | 11/1996 | Araujo et al. | |
| 5,578,503 A | 11/1996 | Karg et al. | |
| 5,589,006 A | 12/1996 | Itoyama et al. | |
| 5,622,634 A | 4/1997 | Noma et al. | |
| 5,626,688 A | 5/1997 | Probst et al. | |
| 5,665,175 A | 9/1997 | Safir | |
| 5,676,766 A | 10/1997 | Probst et al. | |
| 5,726,065 A | 3/1998 | Szlufcik et al. | |
| 5,738,731 A | 4/1998 | Shindo et al. | |
| 5,855,974 A | 1/1999 | Wu et al. | |
| 5,858,819 A | 1/1999 | Miyasaka | |
| 5,868,869 A | 2/1999 | Albright et al. | |
| 5,948,176 A | 9/1999 | Ramanathan et al. | |
| 5,977,476 A | 11/1999 | Guha et al. | |
| 5,981,868 A | 11/1999 | Kushiya et al. | |
| 5,985,691 A | 11/1999 | Basol et al. | |
| 6,001,744 A | 12/1999 | Doi | |
| 6,040,521 A | 3/2000 | Kushiya et al. | |
| 6,048,442 A | 4/2000 | Kushiya et al. | |
| 6,077,722 A | 6/2000 | Jansen et al. | |
| 6,092,669 A | 7/2000 | Kushiya et al. | |
| 6,107,562 A | 8/2000 | Hashimoto et al. | |
| 6,127,202 A | 10/2000 | Kapur et al. | |
| 6,134,049 A | 10/2000 | Spiller et al. | |
| 6,160,215 A | 12/2000 | Curtin | |
| 6,166,319 A | 12/2000 | Matsuyama | |
| 6,169,246 B1 | 1/2001 | Wu et al. | |
| 6,172,297 B1 | 1/2001 | Hezel et al. | |
| 6,258,620 B1 | 7/2001 | Morel et al. | |
| 6,288,325 B1 | 9/2001 | Jansen et al. | |
| 6,294,274 B1 | 9/2001 | Kawazoe et al. | |
| 6,307,148 B1 | 10/2001 | Takeuchi et al. | |
| 6,310,281 B1 | 10/2001 | Wendt et al. | |
| 6,323,417 B1 | 11/2001 | Gillespie et al. | |
| 6,328,871 B1 | 12/2001 | Ding et al. | |
| 6,335,479 B1 | 1/2002 | Yamada et al. | |
| 6,361,718 B1 | 3/2002 | Shinmo et al. | |
| 6,372,538 B1 | 4/2002 | Wendt et al. | |
| 6,380,480 B1 | 4/2002 | Norimatsu et al. | |
| 6,423,565 B1 | 7/2002 | Barth et al. | |
| 6,496,648 B1 * | 12/2002 | Mack et al. | 392/416 |
| 6,537,845 B1 | 3/2003 | McCandless et al. | |
| 6,632,113 B1 | 10/2003 | Noma et al. | |
| 6,635,307 B2 | 10/2003 | Huang et al. | |
| 6,653,701 B1 | 11/2003 | Yamazaki et al. | |
| 6,667,492 B1 | 12/2003 | Kendall | |
| 6,690,041 B2 | 2/2004 | Armstrong et al. | |
| 6,692,820 B2 | 2/2004 | Forrest et al. | |
| 6,784,492 B1 | 8/2004 | Morishita | |
| 6,852,920 B2 | 2/2005 | Sager et al. | |
| 6,878,871 B2 | 4/2005 | Scher et al. | |
| 6,974,976 B2 | 12/2005 | Hollars | |
| 7,122,398 B1 | 10/2006 | Pichler | |
| 7,179,677 B2 | 2/2007 | Ramanathan et al. | |
| 7,194,197 B1 | 3/2007 | Wendt et al. | |
| 7,220,321 B2 | 5/2007 | Barth et al. | |
| 7,235,736 B1 | 6/2007 | Buller et al. | |
| 7,252,923 B2 | 8/2007 | Kobayashi | |
| 7,265,037 B2 | 9/2007 | Yang et al. | |
| 7,303,788 B2 | 12/2007 | Kataoka et al. | |
| 7,319,190 B2 | 1/2008 | Tuttle | |
| 7,364,808 B2 | 4/2008 | Sato et al. | |
| 7,441,413 B2 | 10/2008 | Bae et al. | |
| 7,442,413 B2 | 10/2008 | Zwaap et al. | |
| 7,544,884 B2 | 6/2009 | Hollars | |
| 7,576,017 B2 | 8/2009 | Tuttle | |
| 7,736,755 B2 | 6/2010 | Igarashi et al. | |
| 7,741,560 B2 | 6/2010 | Yonezawa | |
| 7,846,750 B2 | 12/2010 | Boyer | |
| 7,855,089 B2 | 12/2010 | Farris, III et al. | |
| 7,863,074 B2 | 1/2011 | Wieting | |
| 7,863,518 B2 | 1/2011 | Terakawa et al. | |
| 7,875,945 B2 | 1/2011 | Krasnov et al. | |
| 7,910,399 B1 | 3/2011 | Wieting | |
| 7,955,891 B2 | 6/2011 | Wieting | |
| 7,960,204 B2 | 6/2011 | Lee | |
| 7,993,954 B2 | 8/2011 | Wieting | |
| 7,993,955 B2 | 8/2011 | Wieting | |
| 7,998,762 B1 | 8/2011 | Lee et al. | |
| 8,003,430 B1 | 8/2011 | Lee | |
| 8,008,110 B1 | 8/2011 | Lee | |
| 8,008,111 B1 | 8/2011 | Lee | |
| 8,008,112 B1 | 8/2011 | Lee | |
| 8,017,860 B2 | 9/2011 | Lee | |
| 8,026,122 B1 | 9/2011 | Lee | |
| 8,142,521 B2 | 3/2012 | Wieting | |

| | | |
|---|---|---|
| 8,168,463 B2 | 5/2012 | Wieting |
| 8,178,370 B2 | 5/2012 | Lee et al. |
| 8,183,066 B2 | 5/2012 | Lee et al. |
| 8,217,261 B2 | 7/2012 | Wieting |
| 2002/0002992 A1 | 1/2002 | Kariya et al. |
| 2002/0004302 A1 | 1/2002 | Fukumoto et al. |
| 2002/0061361 A1 | 5/2002 | Nakahara et al. |
| 2002/0063065 A1 | 5/2002 | Sonoda et al. |
| 2003/0075717 A1 | 4/2003 | Kondo et al. |
| 2003/0089899 A1 | 5/2003 | Lieber et al. |
| 2003/0188777 A1 | 10/2003 | Gaudiana et al. |
| 2003/0230338 A1 | 12/2003 | Menezes |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0187917 A1 | 9/2004 | Pichler |
| 2004/0191949 A1 | 9/2004 | Iwata et al. |
| 2004/0191950 A1 | 9/2004 | Nakamura et al. |
| 2004/0245912 A1 | 12/2004 | Thurk et al. |
| 2004/0252488 A1 | 12/2004 | Thurk |
| 2004/0256001 A1 | 12/2004 | Mitra et al. |
| 2005/0074915 A1 | 4/2005 | Tuttle et al. |
| 2005/0098205 A1 | 5/2005 | Roscheisen et al. |
| 2005/0109392 A1 | 5/2005 | Hollars |
| 2005/0164432 A1 | 7/2005 | Lieber et al. |
| 2005/0194036 A1 | 9/2005 | Basol |
| 2005/0223570 A1 | 10/2005 | Yonezawa et al. |
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0130890 A1 | 6/2006 | Hantschel et al. |
| 2006/0160261 A1 | 7/2006 | Sheats et al. |
| 2006/0173113 A1 | 8/2006 | Yabuta et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0004078 A1 | 1/2007 | Alberts |
| 2007/0006914 A1 | 1/2007 | Lee |
| 2007/0089782 A1 | 4/2007 | Scheuten et al. |
| 2007/0116892 A1 | 5/2007 | Zwaap et al. |
| 2007/0116893 A1 | 5/2007 | Zwaap |
| 2007/0151596 A1 | 7/2007 | Nasuno et al. |
| 2007/0163643 A1 | 7/2007 | Van Duren et al. |
| 2007/0169810 A1 | 7/2007 | Van Duren et al. |
| 2007/0193623 A1 | 8/2007 | Krasnov |
| 2007/0209700 A1 | 9/2007 | Yonezawa et al. |
| 2007/0243657 A1 | 10/2007 | Basol et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1 | 2/2008 | Mishtein et al. |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 | 4/2008 | Lee |
| 2008/0092954 A1 | 4/2008 | Choi |
| 2008/0105294 A1 | 5/2008 | Kushiya et al. |
| 2008/0110491 A1 | 5/2008 | Buller et al. |
| 2008/0110495 A1 | 5/2008 | Onodera et al. |
| 2008/0115827 A1 | 5/2008 | Woods et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0216886 A1 | 9/2008 | Iwakura |
| 2008/0280030 A1 | 11/2008 | Van Duren et al. |
| 2008/0283389 A1 | 11/2008 | Aoki |
| 2009/0021157 A1 | 1/2009 | Kim et al. |
| 2009/0058295 A1 | 3/2009 | Auday et al. |
| 2009/0084438 A1 | 4/2009 | den Boer et al. |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1 | 9/2009 | Matsushima et al. |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0087027 A1 | 4/2010 | Wieting |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0224247 A1 | 9/2010 | Bartholomeusz et al. |
| 2010/0233386 A1 | 9/2010 | Krause et al. |
| 2010/0258179 A1 | 10/2010 | Wieting |
| 2010/0267189 A1 | 10/2010 | Yu et al. |
| 2010/0267190 A1 | 10/2010 | Hakuma et al. |
| 2010/0297798 A1 | 11/2010 | Adriani et al. |
| 2011/0018103 A1 | 1/2011 | Wieting |
| 2011/0020980 A1 | 1/2011 | Wieting |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0071659 A1 | 3/2011 | Farris, III et al. |
| 2011/0073181 A1 | 3/2011 | Wieting |
| 2011/0203634 A1 | 8/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269260 A1 | 11/2011 | Buquing |
| 2011/0277836 A1 | 11/2011 | Lee |
| 2011/0312162 A1* | 12/2011 | Iacopi .......... 438/478 |
| 2012/0003789 A1 | 1/2012 | Doering et al. |
| 2012/0018828 A1 | 1/2012 | Shao |
| 2012/0021552 A1 | 1/2012 | Alexander et al. |
| 2012/0094432 A1 | 4/2012 | Wieting |
| 2012/0122304 A1 | 5/2012 | Wieting |
| 2012/0186975 A1 | 7/2012 | Lee et al. |
| 2012/0237885 A1* | 9/2012 | Alexander et al. ......... 432/5 |
| 2012/0251428 A1* | 10/2012 | Morioka ............ 423/351 |
| 2012/0264072 A1* | 10/2012 | Tandon ............ 432/18 |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | 2006/126598 A1 | 11/2006 |
| WO | 2007/022221 A2 | 2/2007 |
| WO | 2007/077171 A2 | 7/2007 |
| WO | 2008/025326 A2 | 3/2008 |

OTHER PUBLICATIONS

Chopra et al., "Thin-Film Solar Cells: An Overview", 2004, Progress in Photovoltaics: Research and Applications, 2004, vol. 12, pp. 69-92.

Guillen C., "CuInS2 Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of $CuIn_{1-x}Ga_xSe_2$ Solar Cells on Rigid and Flexible Substrates using Nanoparticle Precursor Inks", Thin Solid Films, 2003, vol. 431-432, pp. 53-57.

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Mehta et al., "A graded diameter and oriented nanorod-thin film structure for solar cell application: a device proposal", Solar Energy Materials & Solar Cells, 2005, vol. 85, pp. 107-113.

Salvador, "Hole diffusion length in n-TiO2 single crystals and sintered electrodes: photoelectrochemical determination and comparative analysis," Journal of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/Polymer Composite Doped with Tetraphenylbenzidine Single Layer Structure Light-emitting Diode", Applied Physics Letters, vol. 69, No. 3, Jul. 15, 1996, pp. 377-379.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Gordillo et al. "Electrical and morphological properties of low resistivity Mo thin films prepared by magnetron sputtering," 9Brazilian Journal of Physics 36:982-985 (Sep. 2006).

Grecu et al. "Spectroscopic Characterization of Chemical Bath Deposited Cadmium Sulphide Layers", Journal of Optoelectronics and Advanced Matenals 6:127-132 (Mar. 2004).

Onuma et al., Preparation and Characterization of CuInS Thin Films Solar Cells with Large Grain, Elsevier Science B.V; Solar Energy Materials & Solar Cells 69 (2001) pp. 261-269.

Palm et al. "Second generation CIS solar modules," Solar Energy 77:757-765 (Dec. 2004).

Scofield "Sodium diffusion, selenization, and microstructural effects associated with various molybdenum back contact layers for CIS-based solar cells", Proceedings of the 24th IEEE Photovoltaic Specialists Conference, pp. 164-167 (1995).

* cited by examiner

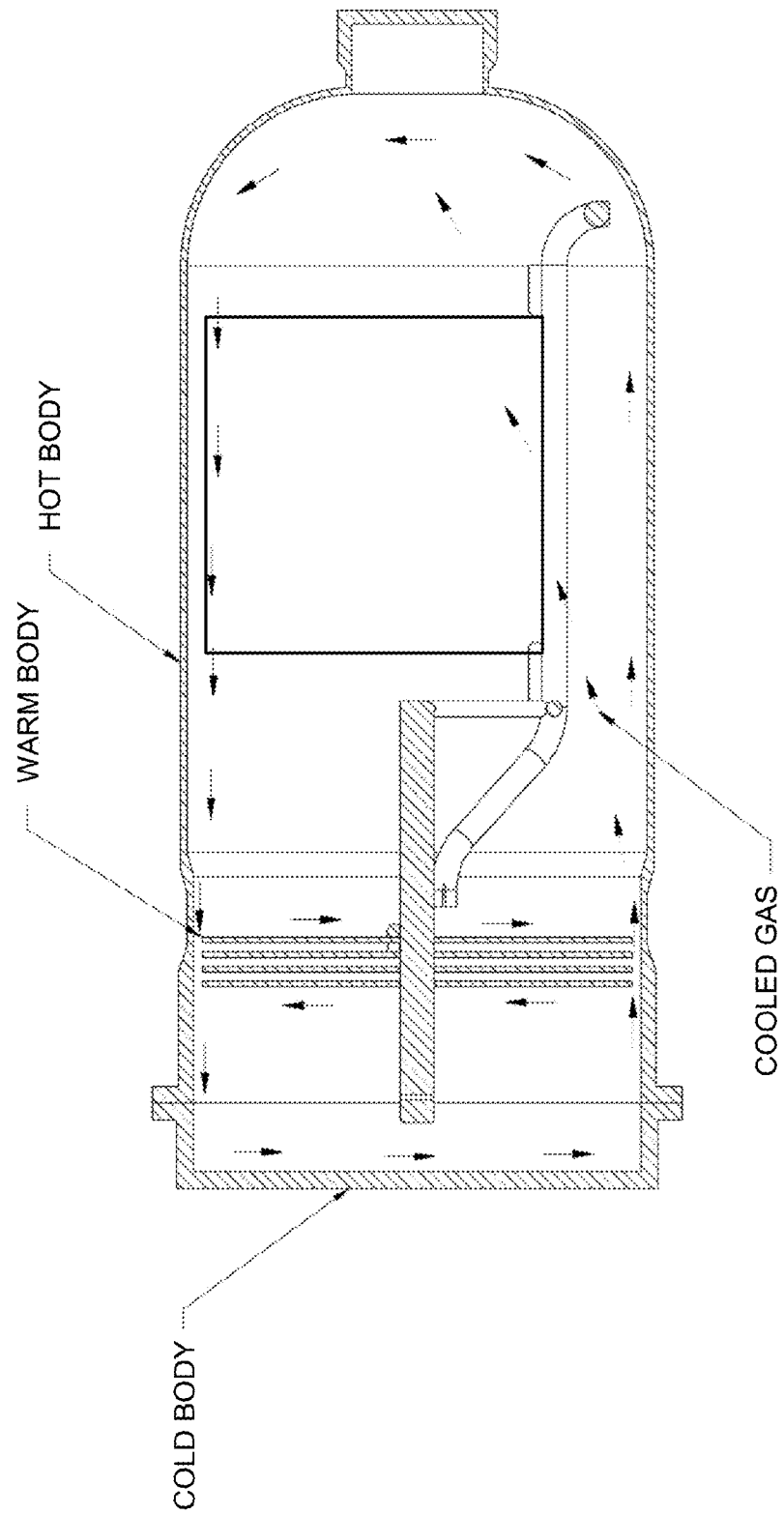

METHOD AND STRUCTURE FOR PROCESSING THIN FILM PV CELLS WITH IMPROVED TEMPERATURE UNIFORMITY

CROSS REFERENCE TO RELATED APPLICATION

This application claims priority to U.S. Provisional Application No. 61/234,983, filed Aug. 18, 2009, commonly assigned, and hereby incorporated by reference in its entirety herein for all purpose.

BACKGROUND OF THE INVENTION

The present invention relates generally to photovoltaic materials and manufacturing method. More particularly, the present invention provides a method and structure for uniform thermal treatment of thin film solar cells. Merely by way of example, embodiments of the present invention include a method and structure for controlling convective flows during reactive thermal process for forming a photovoltaic film stack of solar cells, but it would be recognized that the invention may have other configurations.

From the beginning of time, mankind has been challenged to find ways of harnessing energy. Energy comes in forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable source energy has been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation to electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

As an effort to improve thin film solar cell technology, one or more processes of manufacturing an advanced CIS and/or CIGS based photovoltaic film stack on sized substrates with planar, tubular, cylindrical, circular or other shapes are introduced. There are various manufacturing challenges in forming the photovoltaic film stack, such as maintaining structure integrity of substrate materials, controlling chemical compositions of the ingredients in one or more precursor layers, carrying out proper reactive thermal treatment of the one or more precursor layers within a desired gaseous environment, ensuring uniformity and granularity of the thin film material during reactive thermal treatment, etc. Especially, when manufacturing the thin film based solar cell on large sized substrate, temperature uniformity across whole substrate surface is desired. While conventional techniques in the past have addressed some of these issues, they are often inadequate in various situations. Therefore, it is desirable to have improved system and method for processing thin film photovoltaic devices on planar or nonplanar shaped, fixed or flexible substrates.

BRIEF SUMMARY OF THE INVENTION

Embodiments according to the present invention relates to photovoltaic materials and manufacturing method. More particularly, the present invention provides a method and structure for uniform thermal treatment of thin film solar cells. Merely by way of example, the present method and structure provides controlled convective flows or currents during reactive thermal process for manufacture of thin film based photovoltaic devices, but it would be recognized that the invention may have other configurations.

In a specific embodiment, the present invention provides a method for processing one or more substrates. The method includes providing a furnace having a tube shape between a first end and a second end. The furnace includes an inner wall and the inner wall includes a lower portion and an upper portion. Additionally, the method includes coupling a crescent shaped baffle member to the lower portion of the inner wall. The crescent shaped baffle member divides the furnace in a first spatial region between the crescent shaped baffle and the second end and a second spatial region between the crescent shaped baffle and the first end. The method further includes disposing one or more substrates in vertical orientation from the first end into the first spatial region. Furthermore, the method includes transferring one or more gaseous species into the furnace. Moreover, the method includes supplying thermal energy to the furnace for treating the one or more substrates with the one or more gaseous species.

In a specific embodiment, the one or more substrates, each having a size of 20×20 cm, are maintained at a first temperature near their bottom regions and a second temperature near their top regions. Combined effect of thermal radiation and controlled convection of the one or more working gases within the first spatial region results in a temperature variation no more than 20° C. between the top region and the bottom region.

In an alternative embodiment of the present invention, an apparatus for reactive thermal treatment of thin film photovoltaic devices is provided. The apparatus includes a furnace tube including an inner wall extended from a first end to a second end. The apparatus further includes a gas supply device coupled to the second end and configured to fill one or more working gases into the furnace tube. Additionally, the apparatus includes a cover configured to seal the furnace tube at the first end and serve as a heat sink for the one or more working gases. Furthermore, the apparatus includes a fixture mechanically attached to the cover. The fixture is configured to load an array of substrates into the furnace tube as the cover seals the furnace tube. Moreover, the apparatus includes a shaped baffle member (e.g., crescent) disposed seamlessly at a lower portion of the inner wall for blocking a convection current of the one or more working gases cooled by the cover.

In yet another alternative embodiment, the present invention provides a method for processing one or more substrates. The method includes providing a furnace tube including a first region for holding one or more substrates and a second region having an end cover. Additionally, the method includes maintaining a temperature profile associated with the one or more substrates within the first region. The temperature profile does not vary more than 20 Degrees Celsius. Moreover, the method includes subjecting a copper and indium film overlying the one or more substrates to a gaseous selenide species to form a copper, indium, and selenide containing film on the one or more substrates.

In yet still another alternative embodiment, the present invention provides an apparatus for uniform thermal treatment of thin film devices. The apparatus includes a furnace tube including a circular inner wall extended along an axial direction in horizontal direction from a first end region to a second end region. The apparatus further includes a gas supply device coupled to the second end region for filling a work gas into the furnace tube and a cover member configured to seal the furnace tube at the first end region. Additionally, the apparatus includes a rack fixture mechanically attached to the cover member. The rack fixture is configured to load a plurality of substrates into the furnace tube as the cover member seals the furnace tube. The apparatus further includes a heater surrounded the furnace tube to provide thermal radiation from outside to heat the work gas. Furthermore, the apparatus includes a baffle member disposed at a lower portion of the circular inner wall.

Many benefits can be achieved by ways of the embodiments according to the present invention. Particularly, the method provides a method for performing reactive thermal treatment of a precursor layer to form an absorber of photovoltaic cells. Some embodiments of the present invention provide a structure or apparatus for conducting the reactive thermal treatment in a gaseous environment, which is a furnace made by quartz in tube shape for facilitating convection of one or more working gases supplied therein. In a specific embodiment, one or more crescent shaped baffles are inserted in combination of one or more disk shaped baffles to substantially retain the heated working gases around the substrate while block the cooled working gases to the heated substrate. As the results, the one or more substrates disposed in a vertical orientation within the furnace tube can be maintained with a temperature difference between their top regions and bottom regions substantially small. Therefore, the reaction between the one or more working gases and the precursor layer on the substrates is conducted with improved temperature uniformity, leading to formation of a photovoltaic film stack with desired high light energy conversion efficiency. Depending on the embodiment, one or more of these benefits may be achieved. These and other benefits will be described in more detailed throughout the present specification and particularly below.

BRIEF DESCRIPTION OF THE DRAWINGS

FIG. 7A is a simplified diagram illustrating a convection current without the crescent shaped baffle.

DETAILED DESCRIPTION OF THE INVENTION

Embodiments according to the present invention relates to photovoltaic materials and manufacturing method. More particularly, the present invention provides a method and structure for processing thin film solar cells on shaped substrates with improved temperature uniformity. Merely by way of example, the present method and structure are applied for manufacture of copper indium gallium diselenide based thin film photovoltaic devices on shaped substrates, but it would be recognized that the invention may have other configurations.

Figure 1:
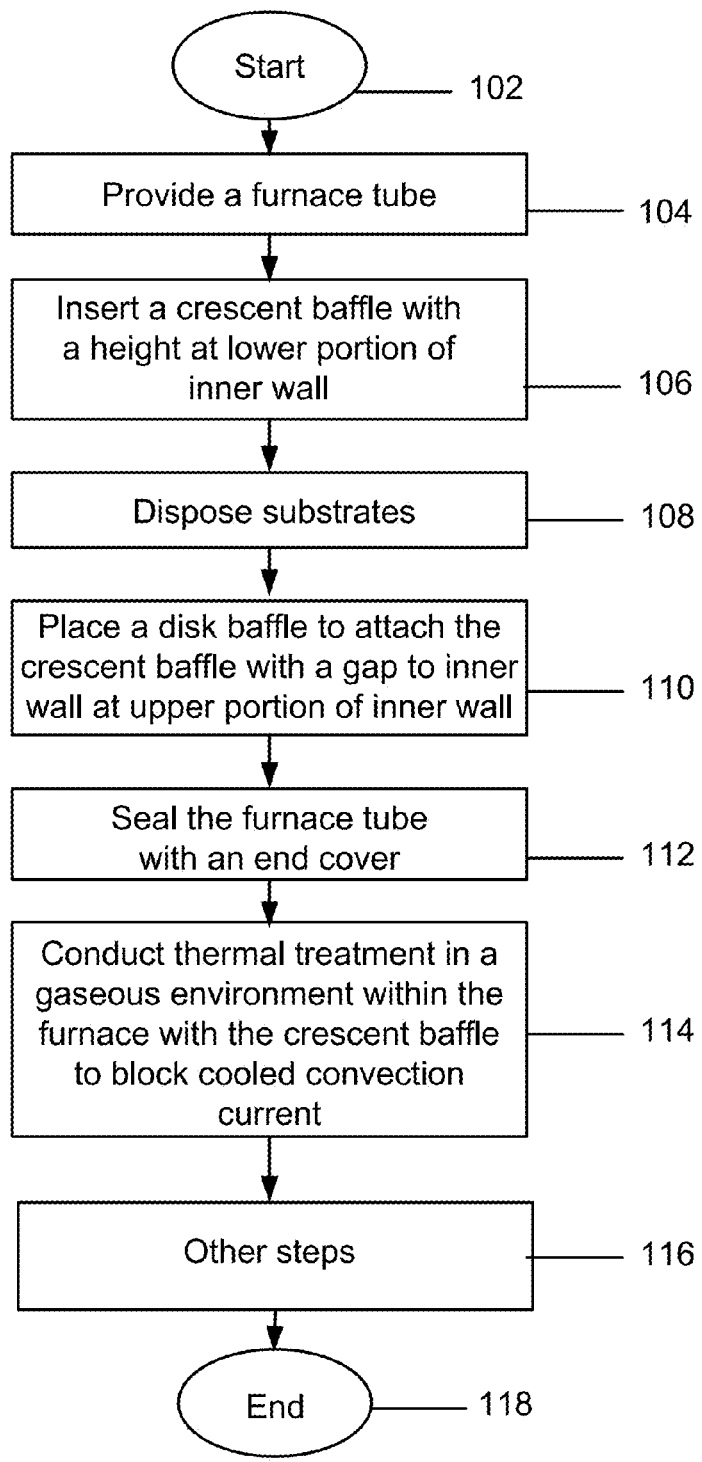
FIG. 1 is a simplified process flow diagram illustrating a method of processing a photovoltaic film stack on shaped substrate according to an embodiment of the present invention.

FIG. 1 is a simplified process flow diagram illustrating a method of processing a photovoltaic cell with improved substrate temperature uniformity according to an embodiment of the present invention. As shown, the method 100 begins with a start step (step 102). In step 104, a furnace for conducting reactive thermal processing to photovoltaic devices is provided. In particular example, the furnace is characterized by a length of tube container with an inner diameter and an outer diameter enclosing a volume of space capped by a first end region and a second end region. In an embodiment, the tube container with a smoothed inner wall is utilized for facilitating internal convection of air or gases. Thus, in this specification the furnace sometime is also referred to furnace tube. In another embodiment, the furnace tube is set in an orientation with its tube axis along horizontal (or floor) direction. The first end region is open and can be engaged and sealed with an end cover. The second end region is closed and couples a fixture that can be installed with a gas valve or other types of gas supplier for providing a desired gaseous environment for thermal treatment of any work samples within the furnace. The volume of space is set to have a plurality of shaped substrates loaded for corresponding treatment process. For example, 15 or more planar substrates in 20×20 cm square shape can be loaded in for treatment at the same time. In an embodiment, the furnace tube is made of quartz material which is semi-transparent to thermal radiation so that a heater can be installed surrounding outside of the furnace tube.

In step 106, a crescent shaped baffle with a height is inserted to the furnace tube and disposed to a position to attach with a lower portion of an inner wall of the furnace tube. The crescent shaped baffle is made of quartz and has a curved body with a height and a curvature substantially similar to that of the inner wall. As it is installed, the crescent shaped baffle can be seamlessly fitted to the lower half of the inner wall. In an embodiment, the crescent shaped baffle can have an arc length about one half of an inner perimeter of the furnace tube or less. In another embodiment, the crescent shaped baffle can have an arc length about ⅔ of an inner perimeter of the furnace tube or less. In another embodiment, the crescent shaped baffle can have an arc length ranging from one half to about ⅔ of an inner perimeter of the furnace tube. In an embodiment, the height and the arc length are parameters adjustable for achieving desired adjustment to the convection flows or currents passed by.

As used herein, the term "crescent" means a "shape produced when a circular disk has a segment of another circle removed from its edge, so that what remains is a shape enclosed by two circular arcs of different diameters which intersect at two points," although there can be variations, modifications, and alternatives, according to one or more embodiments. For example, some descriptions or definitions can be found in public information website such as http://en.wikipedia.org/wiki/Crescent. As an example, the term can include one or more crescent shaped members, although there can also be partial crescent shaped members. In other embodiments, other shaped configurations and/or sizes may be used. One of ordinary skill in the art would also recognize variations, modifications, and alternatives.

As used herein, the terms lower and/or upper are to be interpreted by ordinary meaning, and do not have any specific reference regarding to the direction of gravity according to one or more embodiments. In some embodiments, the terms lower and/or upper can be reference to gravity, although there can be some general variations, modifications, and alternatives. Again, one of ordinary skill in the art would recognize variations, modifications, and alternatives.

Referring to FIG. 1, the method 100 further includes disposing one or more substrates into the furnace tube (step 108). In an embodiment, each of the one or more substrates can be a planar shaped substrate like a panel of glass. In an example, the substrate is a 20×20 cm square shaped glass. The glass material specifically is a soda lime glass which is widely used for the substrate of solar cell. In other embodiments, the substrate can be made of other transparent materials including fused silica, quartz, and others. In some embodiments, the substrates with other shapes including planar rectangular, square, and disk, and non-planar cylindrical rod, tube, semi-cylindrical tile, or even flexible foil can be used depending on applications.

In an embodiment, each of the one or more substrates has one or more overlayers formed by some earlier processes. For example, a precursor layer including copper species, indium species, and/or indium-gallium species may be formed on a surface of the substrate using sputtering technique. In a subsequent reactive thermal treatment process, the precursor layer can be reactively treated in a gaseous environment within the furnace tube containing selenide species, or sulfuride species, and nitrogen species, etc. When the furnace tube is heated so do the working gases and the substrates, and the gaseous selenium reacts with the copper-indium-gallium species in the precursor layer. As a result of the reactive thermal treatment, the precursor layer is transformed to a photovoltaic film stack containing copper indium (gallium) diselenide (CIGS) compound, which is a p-type semiconductor in electronic nature and serves as an absorber layer for forming photovoltaic cells. More detail descriptions about the thermal treatment process for forming the CIGS photovoltaic film stack of thin film solar cells can be found in U.S. Patent Application No. 61/178,459 titled "Method and System for Selenization in Fabricating CIGS/CIS Solar Cells" filed on May 14, 2009 by Robert Wieting, commonly assigned to Stion Corporation of San Jose and hereby incorporated by reference.

In another embodiment, each substrate is disposed inside the furnace in a substantially vertical orientation and in parallel to each other as an array. In particular, each of the one or more substrates is loaded first into a substrate holder, then the substrate holder is removably put on a fixture. The fixture can have an extended part that is attached to a cover member. The cover member is configured to seal the furnace tube by engaging with the first end region. The fixture including the extended part forms an integrated structure with the cover member. When the one or more substrates are loaded via the fixture along a horizontal direction into the furnace tube the cover member will approach the first end region. Once the cover member engages the first end region and seal the furnace tube, the one or more substrates also are loaded in positions inside the volume of space enclosed by the furnace tube. In particular, each substrate maintains a substantially vertical orientation relative to the floor within the furnace tube. In a specific embodiment, for a planar shaped substrate the substrate plane is substantially along the direction of the tube axis. In an implementation of the invention, the fixture and the extended part are also made of quartz material.

Additionally, the fixture with extended part also includes at least a disk shaped baffle located near the cover member. The disk shaped baffle is pre-fixed with the extended part with its disk plane in a cross-sectional orientation perpendicular to the tube axis. In an embodiment, the disk shaped baffle position on the extended part is chosen such that as the cover member seals the furnace tube at the first end region the disk shaped baffle is attached with the crescent shaped baffle. Additionally, the disk shaped baffle has a disk plane with an area smaller than a cross section area of the inner wall. Therefore, a gap between peripheral rims of the disk shaped baffle and the inner wall exits. The method 100 includes disposing the disk shaped baffle to attach with the crescent shaped baffle with the height and leave the gap to the upper portion of the inner wall (step 110). Further, the height of the crescent shaped baffle is pre-set to be greater than a width of the gap so that the crescent shaped baffle substantially blocks the gap of the disk shaped baffle to the lower portion of the inner wall. Furthermore, the disk shaped baffle attaches to the crescent shaped baffle to naturally divide the volume of space of the furnace tube into two parts: A first spatial region includes the loaded one or more substrates between the crescent shaped baffle and the second end region and a second spatial region is between the cover member at the first end region and the crescent shaped baffle. As the disk shaped baffle is disposed the way described above, the first spatial region is only linked to the second spatial region through the gap between the disk shaped baffle and the upper portion of the inner wall because the crescent shaped baffle substantially blocks the gap at the lower portion. In a specific embodiment, the disk shaped baffle is also made of quartz material.

The method 100 further includes using the cover member to close the first end region and seal the furnace tube (step 112). In fact, the step 112 is, at least partially, correlated to the step 108 of loading the one or more substrates to a desired configuration and step 110 of positioning a disk shaped baffle to attach with the crescent shaped baffle. In a specific embodiment, both the substrate holder and the disk shaped baffle are removably or fixedly attached to the fixture that is physically coupled to the cover member. Therefore, the cover member has been in place of engaging with the first end region of the furnace tube after performing the step 108 and step 110. In an example, the cover member can be made of stainless steel, e.g., 304 SST. In an embodiment, the cover member is kept cool to have a relative cold surface serving as a heat sink to the gases passed by.

In step 114 the method 100 includes providing a gaseous environment in the whole volume of space of the furnace tube then conducting reactive thermal treatment process in the gaseous environment within the furnace tube according to certain predetermined temperature ramping profiles. In an embodiment, gaseous species including one or more working gases are supplied into the furnace tube from a gas supply device such as a valve or injector coupled to the second end region of the furnace tube. The one or more working gases include at least a chemical precursor designed to react with the precursor layer overlying the substrate loaded within the first spatial region in the reactive thermal treatment process for forming photovoltaic film stack. The one or more working gases also include a carrier gas for controlling the pressure during the chemical reaction and thermal annealing. The carrier gases can be selected from nitrogen, helium, argon, and other inert gases.

In another embodiment, the furnace tube is heated by a heater disposed outside the furnace tube to provide thermal radiation. The tube interior is in round shape and smooth for facilitating the convection currents therein. The one or more working gases are also heated by the thermal radiation and would flow upward from a bottom region of each substrate to its top region, thereby inducing a convection gas flow or current that carries heat around. The substrate itself other than is heated directly by the thermal radiation from the outside heater, also is affected by the internal convection current. Over time, the substrate can be maintained in a steady-state temperature profile across its body along the vertical direction. In particular, the temperature profile can be a substantially monotonic varying from a first temperature near the bottom region to a second temperature near the top region. The second temperature usually is higher than the first temperature as the heated gas flows upward. On the one hand, the precursor gas species among the one or more working gases will react with the precursor layer overlying the substrate along their way upward from the bottom region to the top region of each substrate in the first spatial region. On the other hand, the remaining species of the one or more working gases (including non-reacted precursor gas, residue solid-phase particle, and carrier gas) near the upper portion of the inner wall continue to flow horizontally towards area at relative lower temperature. In an embodiment, the heated gas current flows through the gap to the upper portion of the inner wall from the first spatial region to the second spatial region where the temperature is lower. In particular, the cover member can be kept cool, which cools the gases passed by. The (relatively) cooled gases in the second spatial region flow downward to the lower half of the inner wall. Because of the installation of the crescent shaped baffle, the cooled gases cannot flow back to the first spatial region through the gap to the lower portion of the inner wall. This effectively restrict the cooled gases re-join the convection currents within the first spatial region where the inner wall of the furnace tube, surface of the disk shaped baffle, fixture body are relative warm or heated. As a result, the convection currents within the first spatial region are much uniform in temperature, leading to an improved temperature uniformity on the array of substrates. For example, for an array of 15 substrates each having a size of 20×20 cm the second average temperature near the top regions is less than 20 degrees higher than the first average temperature near the bottom regions. Of course, the gap to the upper portion of the inner wall can allow some gases flowing back from the second spatial region to the first spatial region. But those gases have been relatively warmed up so that they can first flow upward above the level set by the crescent shaped baffle.

In a specific embodiment of the present invention, the cover member is kept cool for serving as a surface to absorb some unwanted particles. For example, after reactively passing through the substrate surface the one or more working gases may generate some residue particles or nonreactive solid phase particles. Specifically for processing thin film photovoltaic device, the precursor layer comprises copper, indium, or gallium species and the reactant species in the working gases includes gas-phase selenium species. During the treatment, some solid phase selenium particles in micron or bigger sizes may form. The one or more embodiments of the present invention can allow these unwanted particles being transferred out of major reaction space by the convection current. When these particles are transferred into the second spatial region with relative cold surface of the cover member, they can be absorbed there. Furthermore, the disk shaped baffle together with the added crescent shaped baffle serves a physical barrier to prevent these particles from contaminating the photovoltaic film stack on the substrate. Without the crescent shaped baffle, of course, the cooled gases including some contaminant particles can directly flow through the gap of the disk shaped baffle towards the bottom region of the substrates, causing a low value for the first average temperature near the bottom region of the substrate and introducing possible contamination to the device.

In a specific embodiment, the method performs other steps to complete the reactive thermal treatment of the photovoltaic film stack. These other steps (116) can include adding second or third disk shaped baffle member in parallel to the disk shaped baffle, each having a distance away from each other, adding thermal insulation between the first spatial region and the second spatial region. The cover member, when necessary, may be in contact with a cold source for further reducing its surface temperature as a heat sink. The gap width may be configured to be changeable so that when the thermal process in its ramping down stage the width of gap can increase to allow cooled convection current flowing from the second spatial region into the first spatial region. The method ends with an end step (Step 118). Of course there can be other variations, modifications, and alternatives.

The above sequence of steps provides a method of processing a photovoltaic device on a shaped substrate according to an embodiment of the present invention. Depending on the embodiment, one or more steps may be added, one or more steps may be eliminated, and one or more steps may be performed in a different sequence without departing from the scope of the claims herein. One skilled in the art would recognize other variations, modifications, and alternatives.

Figure 2:
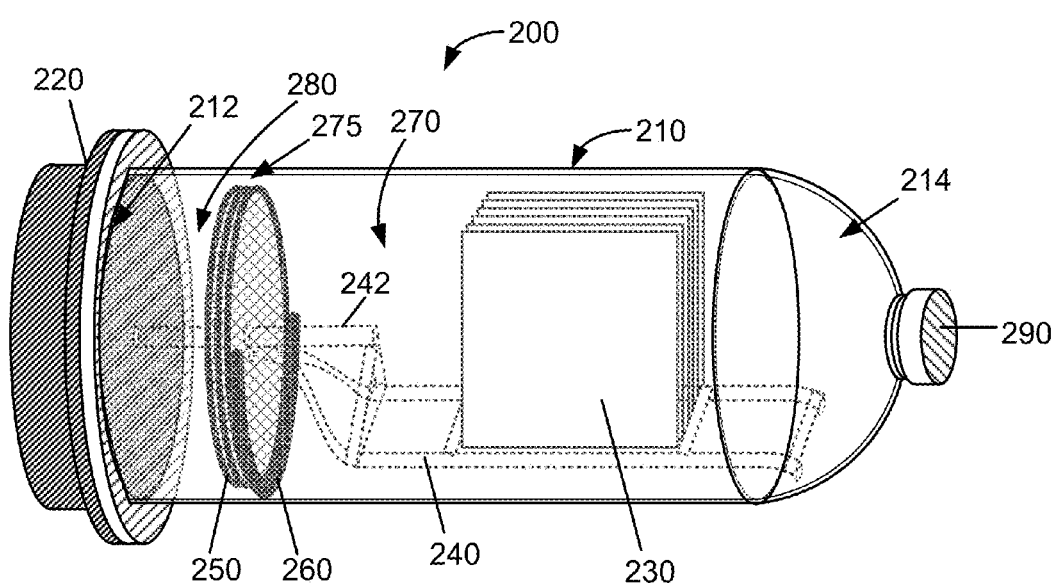
FIG. 2 is a simplified perspective view illustrating furnace tube for manufacturing a photovoltaic cell according to an embodiment of the present invention.
Figure 3:
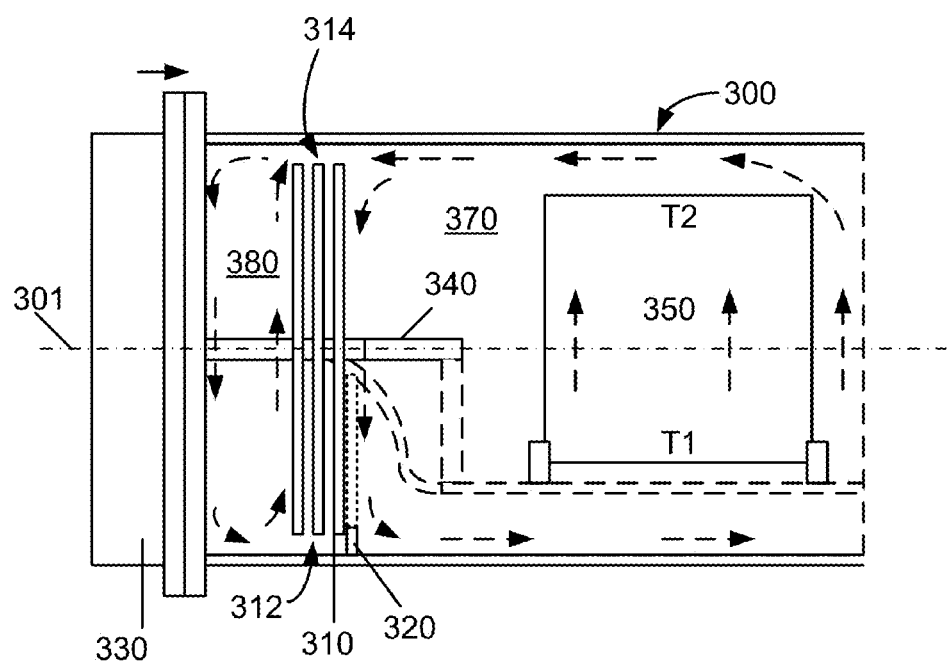
FIG. 3 is a simplified cross-sectional view illustrating baffles for convection control in a thermal treatment apparatus with according to an embodiment of the present invention.
Figure 4:
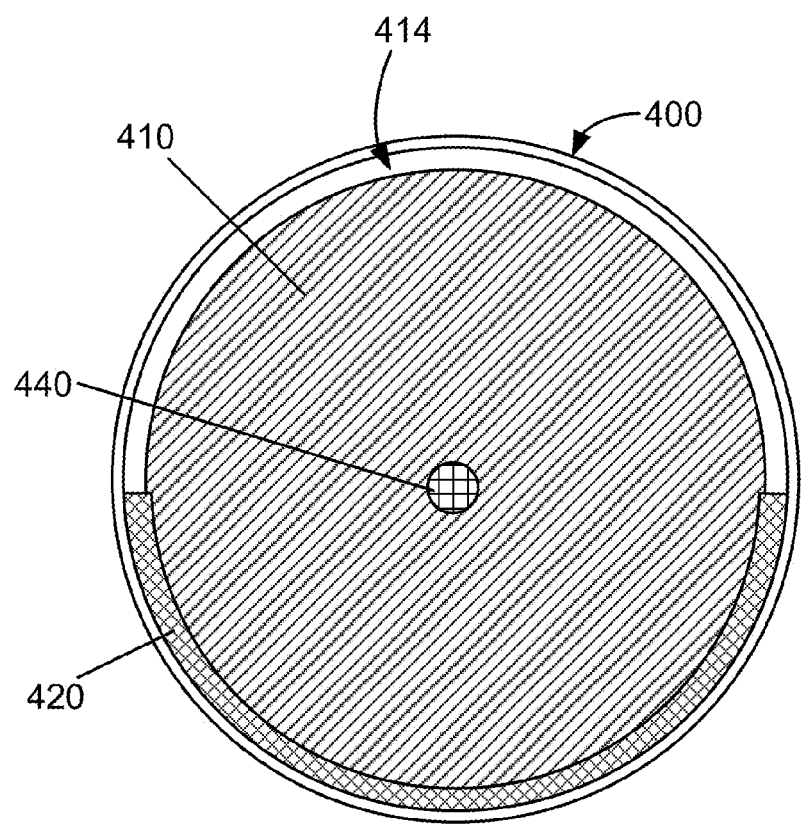
FIG. 4 is another simplified cross-sectional view illustrating baffle structure for convection control in a thermal treatment apparatus according to an embodiment of the present invention.

FIGS. 2-4 are simplified diagrams illustrating a structure for controlling internal convection flow by inserting a crescent shaped baffle in combination of one or more disk shaped baffles within a furnace tube according to embodiments of the present invention. These diagrams are merely examples and should not unduly limit the claims herein. One skilled in the art would recognize other variations, modifications, and alternatives. As shown in FIG. 2, a simplified perspective view of a furnace tube for manufacturing a photovoltaic cell is set with its tube axis along the floor direction. The furnace tube 200 includes a substantially cylindrical tubular container 210 capped by a first end region 212 and a second end region 214. The first end region 212 is covered by an end cover 220 which is configured to be vacuum sealed. The second end region 214 has a hemispherical shape fixedly coupled to an application device 290, for example, a gas supply device, valve or injector, or the likes. The furnace tube 200 is made of quartz material with preferred properties including low thermal conductivity and at least semi-transparent to thermal radiation.

Referring to FIG. 2, a plurality of shaped substrates 230 can be loaded via a fixture 240 into a volume of space enclosed by the cylindrical tubular container 210. In a specific embodiment, each of the shaped substrates 230 is a planar panel made from a soda lime glass. In an example, the soda lime glass in square shape with a size of 20×20 cm is used. Other suitable transparent materials such as quartz, fused silica, solar glass can also be used. Other non-planar shaped substrates including cylindrical, disk, hemi-cylindrical, tubular, or others can be used depending on applications. In an embodiment, each of the planar substrates 230 is disposed in substantially vertical orientation. The fixture 240 is coupled to the end cover 220 via an extended part 242. As shown in FIG. 2, in the first end region 212 near the end cover 220 one or more disk shaped baffles 250 are disposed substantially along a cross-sectional plane of the cylindrical tubular container 210. Next to the last disk shaped baffle 250 further inside the container, a crescent shaped baffle 260 is disposed at the lower half of an inner wall of the cylindrical tubular container 210 and in contact with the last disk shaped baffle 250. In an embodiment, the one or more disk shaped baffles 250 effectively divide the tubular container 210 into two parts: one is a first spatial region 270, a major portion of the volume of space enclosed in the container, including the one or more loaded substrates; another one is a second spatial region 280 between the end cover 220 and the crescent shaped baffle 260 (plus the disk shaped baffle 250). As the last disk shaped baffle 250 is attached physically with the crescent shaped baffle 260 at the lower portion of the inner wall to block the gap therein, the second spatial region 280 is only linked to the first spatial region 270 via the gap 275 to the upper portion of the inner wall.

In an implementation, the fixture 240 including the extended part 242, the disk shaped baffles 250, and the crescent shaped baffle 260 are all made of quartz material, or substantially the same material for the furnace tube to make a consistent thermal properties in environmental structures. The end cover 220 can be made by stainless steel, for example, 304 SST, for its vacuum compatibility, chemical inert to various working gases, and feasible to be a heat sink. Cooling the end cover 220 can be achieved by thermal conduction via direct contact with a cold element or convection heat exchange via running cold water through internal piping of the end cover 220. Of course, there can be many alternatives, modifications, and variations.

FIG. 3 is a simplified cross-sectional view illustrating baffles for convection control in a thermal treatment apparatus according to an embodiment of the present invention. This diagram is merely an example, and should not unduly limit the claims herein. One skilled in the art would recognize other variations, modifications, and alternatives. As shown, a cylindrical shaped furnace structure 300 has a rectangular shape with its tube axis 301 in this cross-sectional plane along a horizontal or floor direction. The disk shaped baffles 310 with a planar surface placed in an orientation perpendicular to the tube axis 301. In an embodiment, each of the disk shaped baffles 310 can have a size smaller than the inner space of the furnace structure 300, leaving a ring-shaped gap 312/314 surrounding the peripheral rim of the disk shaped baffles 310 to an inner wall of the furnace structure 300. Additionally, each disk shaped baffle 310 can be disposed an adjustable distance away from each other, providing certain thermal insulation between each other and a desired adjustment to the gas flows both through the gap 314. In an embodiment, the disk shaped baffles 310 divides the internal space of the furnace structure 300 into two parts: one is a first spatial region 370 occupying a major portion of the internal space and another is a second spatial region 380 taking a smaller portion near an end cover 330.

Within the first spatial region 370, a planar substrate 350 is disposed in vertical orientation and in parallel to the tube axis 301. When the furnace structure 300 is heated by thermal radiation (heater is not shown and can be set outside the furnace structure), the substrate 350 is characterized by a substantially monotonic temperature profile in terms of an average temperature T1 associated with a bottom region and another average temperature T2 associated with a top region. At the same time, the gases inside the furnace structure 300, in particular inside the first spatial region 370, also are heated and form a convection current as indicated by those arrows with dashed line shown in FIG. 3. The heated gases will flow upward from the bottom region to the top region of the substrate 350, then follow the upper portion of the inner wall to flow laterally to sides where is relatively lower in temperature. The cooled (relatively) can flow down along the sides and form a complete circulation of the convection current. Over time, the average temperatures T1/T2 associated with the bottom/top regions of the substrate 350 is affected by both the direct thermal radiation and the convection current.

In an implementation, the heated gases near the upper portion of the inner wall can pass through the gap 314 from the first spatial region 370 into the second spatial region 380. As the gases reach the end cover 330 that seals with the furnace structure 300, the gases can be cooled by the end cover 330. The cooled gases will flow downward within the second spatial region 380 and laterally near the lower portion of the inner wall in the gap 312. As the crescent shaped baffle 320 blocks the gap 320, the gases can not return back to the first spatial region 370. When the gases become somewhat heated again, they will flow upwards to have a complete circulation of convection current limited within the second spatial region 380. Of course, a partial portion of the gases being re-heated within the second spatial region 380 can flow back to the first spatial region through the gap 314 only when they are heated and flow above the level of the crescent shaped baffle 320. As shown in the embodiment, the crescent shaped baffle 320 in combination of the disk shaped baffles 310 restricts a convection current with relative warm gases within the first spatial region 370 that includes the substrates 350. While the same baffle combination also restricts the cooled gases flowing back from the second spatial region 380. This leads to a final substrate temperature profile with much improved temperature uniformity. In particular, the temperature difference between T1 and T2 is much reduced. In a specific embodiment, the temperature difference between T1 and T2 is substantially reduced to no greater than 20° C. for an array of substrates having sizes of 20×20 cm. In another specific embodiment, the temperature difference between T1 and T2 may be substantially reduced to no greater than 10° C. or less.

FIG. 4 is another simplified cross-sectional view illustrating baffle structure for convection control in a thermal treatment apparatus according to an embodiment of the present invention. This diagram is merely an example, and should not unduly limit the claims herein. One skilled in the art would recognize other variations, modifications, and alternatives. As shown, the thermal treatment apparatus 400 is a furnace tube substantially the same as the furnace structure 300 but in a cross section perpendicular to the tube axis 301. In this cross-sectional view, a disk shaped baffle 410 is installed via a central fixture 440 (which can be coupled to an end cover, not visible). The disk shaped baffle 410 is intended for controlling the internal convection current by leaving a ring-shaped gap 414 between a peripheral rims of the disk shaped baffle and an inner wall of the furnace tube 400. In an embodiment, a crescent shaped baffle 420 is installed to attach with the disk shaped baffle 410 at a lower portion of the inner wall. In this configuration as shown in FIG. 4, the crescent shaped baffle 420 characterized by an arc shape with a height and arc length has a same curvature as the inner wall of the furnace tube so that it seamlessly fits the inner wall. Therefore, the crescent shaped baffle 420 can substantially block the lower portion of the gap 414 if its height is greater than a width of the gap there. In an example, the height of the crescent shaped baffle 420 is about 10% greater than the width of the ring-shaped gap 414. In another embodiment, the arc length of the crescent shaped baffle 420 may be one half of the perimeter of the furnace tube or smaller, or may be ⅖ of the perimeter or smaller, or ranging from one half to ⅔ of the perimeter, or others depending on applications. Though FIG. 4 shows a symmetric circular furnace tube, the claim herein is not limited to that shape. Other geometric structures with symmetric and or even non-symmetric arrangement of the crescent shaped baffle associated with the furnace tube are possibly utilized depending on embodiments. Of course, there can be other variations, modifications, and alternatives.

Figure 5:
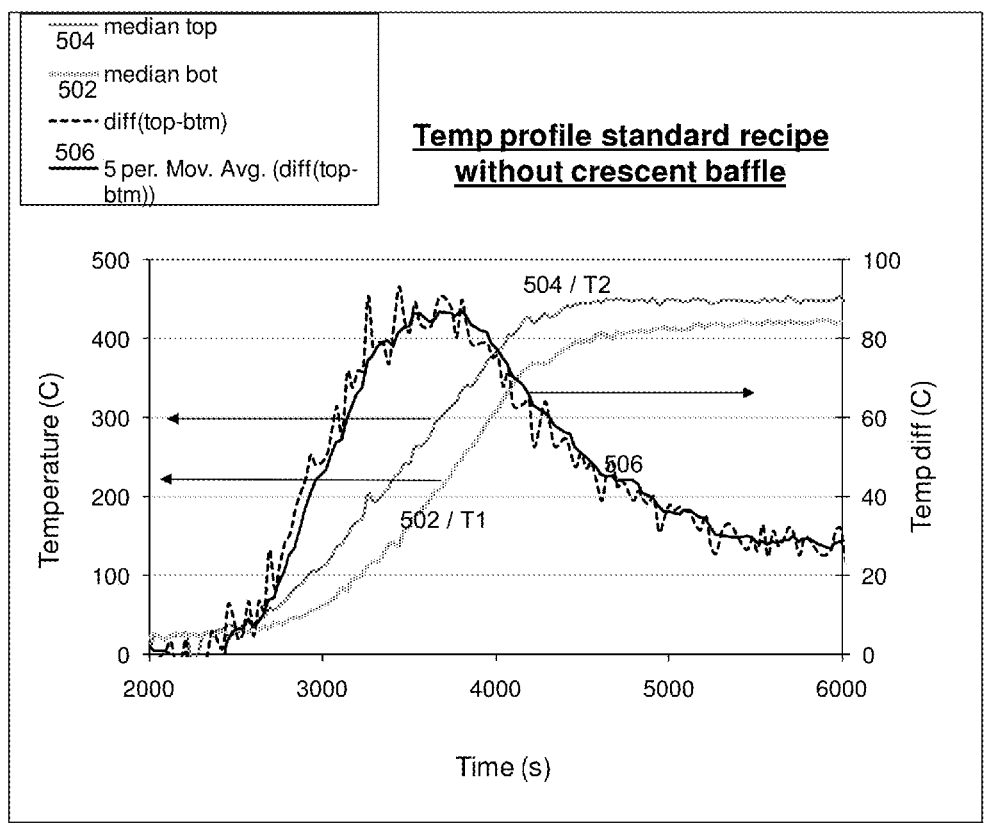
FIG. 5 is a simplified diagram illustrating a substrate temperature profile in a furnace tube without inserting a crescent shaped baffle.

FIG. 5 is a simplified diagram illustrating a temperature profile in a furnace tube without inserting a crescent shaped baffle. As shown, the temperature profile is experimentally obtained by performing a thermal treatment process for 5 slots of substrates loaded in substantially vertical orientation into a standard furnace tube with its tube axis along a floor direction. For example, the furnace tube used here can be the furnace tube 200 described in FIG. 2 but without inserting the crescent shaped baffle 260. Each of the 5 slots of substrates is separately measured at both a bottom region to obtain a first temperature and at a top region to obtain a second temperature. Then a first averaged temperature T1 is obtained by averaging the first temperature value for total 5 slots of substrates. Similarly, a second averaged temperature T2 is obtained by averaging the second temperature value for the total 5 slots of substrates. The temperature measurements are conducted during the thermal treatment process by collecting a plurality of time points. As the results, the values of T1 and T2 are plotted over time to give curve 502 and curve 504, respectively. The same plot also includes a temperature difference curve (dashed line) and a running average (over 5 data points) curve 506. As shown, even when the thermal treatment process proceeds a relative long time with a presumably steady state inside the furnace tube, the temperature difference is still greater than 20° C. This poor temperature uniformity over the substrate certainly is not desirable for manufacture high efficiency thin film photovoltaic cell.

Figure 6:
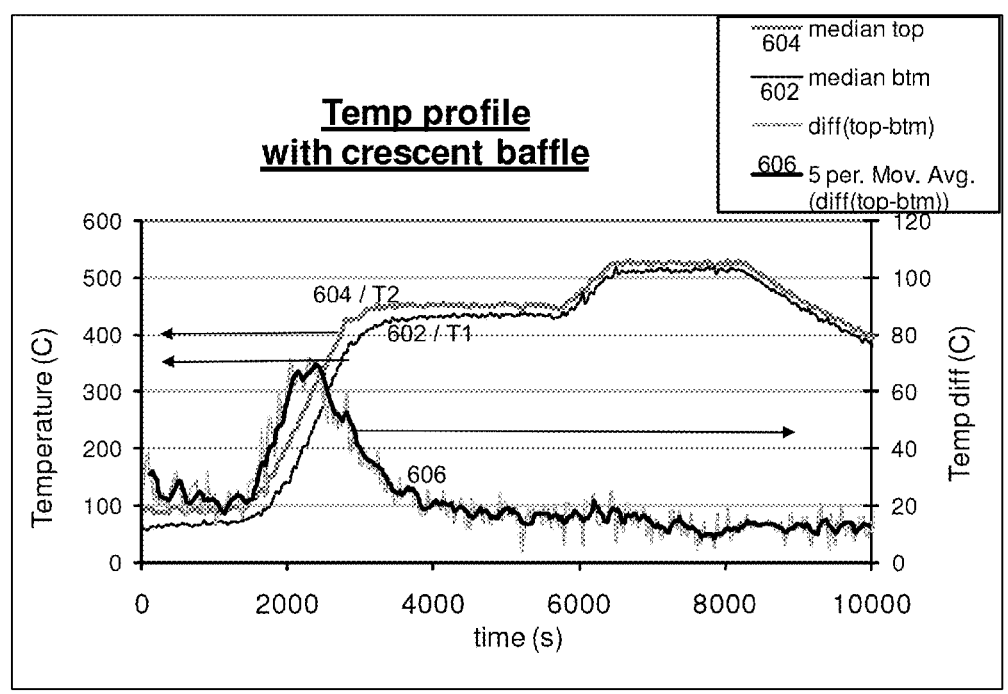
FIG. 6 is a simplified diagram illustrating a substrate temperature profile in a furnace with an inserted crescent shaped baffle according to an embodiment of the present invention.

FIG. 6 is a simplified diagram illustrating a substrate temperature profile in a furnace with an inserted crescent shaped baffle according to an embodiment of the present invention. As shown, the temperature profile is experimentally obtained by performing a thermal treatment process for 5 slots of substrates loaded in substantially vertical orientation into a furnace tube including an inserted crescent shaped baffle according to a specific embodiment. In an example, the furnace tube with an inserted crescent shaped baffle can be the furnace tube 300 or 400 described respectively in FIG. 3 and FIG. 4. The added crescent shaped baffle plays its role to control the internal convection current, as described in FIGS. 2-4. As the result, bottom region temperatures T1 averaged over 5 slots of substrates are plotted as curve 602 and top region temperatures T2 averaged over the same 5 slots of substrates are plotted as curve 604. Similarly, a temperature difference curve (dotted line) and a running average (over 5 data points) curve 606 is provided in the same plot. Now, with a controlled internal convection by the crescent shaped baffle, the temperature variation from the bottom regions to the top regions of the substrates is much reduced. In the example shown by FIG. 6, the temperature difference is almost reduced by half compared to that without inserting a crescent shaped baffle. In an optimized implementation, the temperature difference can be reduced to 20° C. or less. In a specific embodiment, the observed temperature difference across the substrate during the thermal treatment process is only about 6° C. or less, depending on particular furnace structure, baffle structure, substrate arrangement and shape, and other environmental configurations. Of course, there can be other variations, modifications, and alternatives.

FIG. 7A is a simplified diagram illustrating a convection current without the crescent shaped baffle. As shown, the furnace tube contains at least a substrate supported by a fixture coupled to an end cover. As the furnace tube is heated, the main portion of the furnace tube is of course a hot body. Several disk shaped baffles are installed via the fixture near the end cover and are relatively warm body. The disk shaped baffles naturally divides the furnace tube into a major portion and a minor portion wherein each portion can has its own convection circulation, indicated by those short arrows. Within the major portion including the substrate, the surround bodies are warm or hot so that the gas there tend to stay warm except a partial portion of the gas can flow through the gap between the disk shaped baffles and the inner wall. However, within the minor portion bound with cold body like the end cover, the gas passing by can be cooled and flow downward. Without a crescent shaped baffle, the cooled gas can sleek through the gap to the lower portion of the inner wall back to the major portion and flow towards the bottom region of the substrate, indicated by the arrows. This would lead to a lower value to the temperature near the bottom region, causing relatively big temperature difference across the substrate, especially for substrate with a large physical size.

Figure 7B:
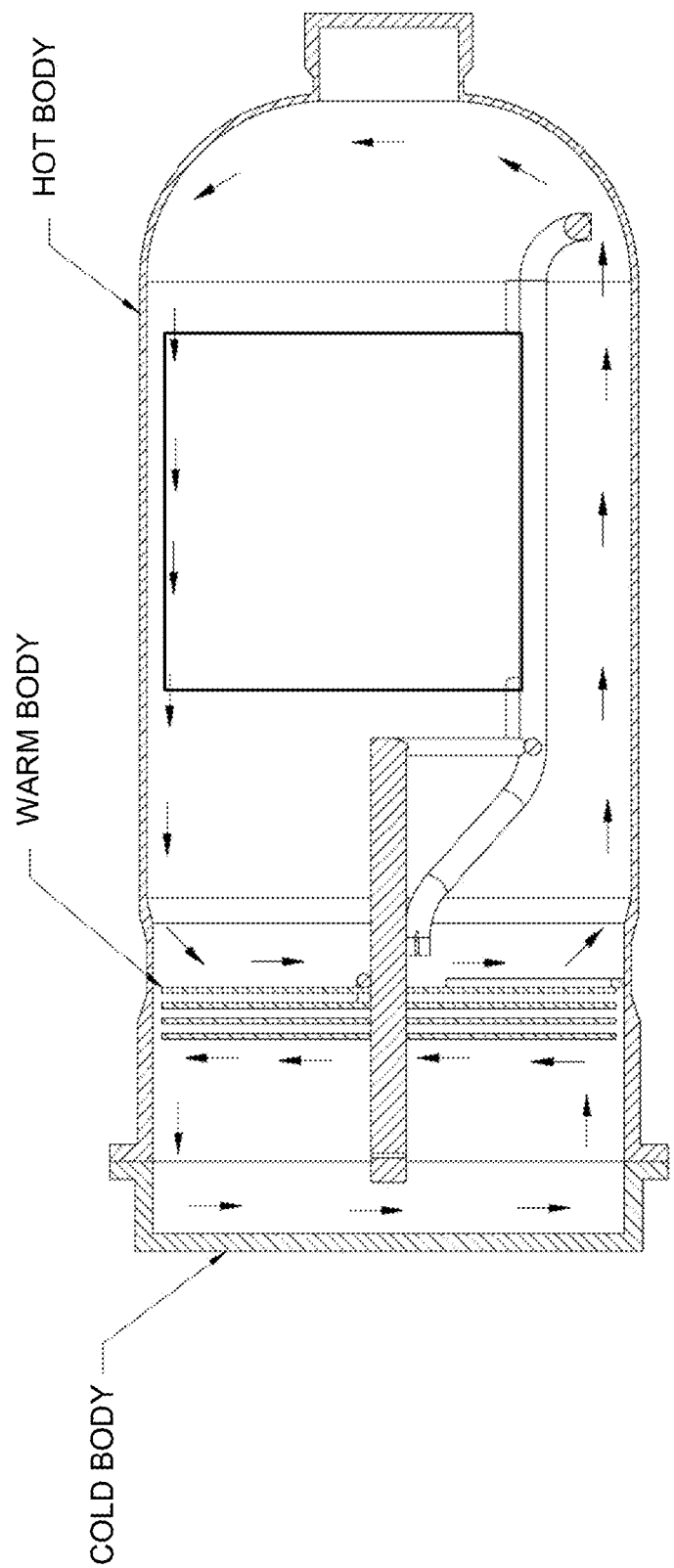
FIG. 7B is a simplified diagram illustrating a convection current with the crescent shaped baffle according to an embodiment of the present invention.

FIG. 7B is a simplified diagram illustrating a convection current with the crescent shaped baffle according to an embodiment of the present invention. As shown, the same furnace tube above is added a crescent shaped baffle attached next to the disk shaped baffle so that the gap to the lower portion of the inner wall is blocked. As the result, the cooled gas in the minor portion can no longer flow into the major portion. Any gas flowing from the minor portion (associated with the cold body of the end cover) can only through the gap to the upper portion of the inner wall, where the gas has been already warmed up. Therefore, the inserted crescent shaped baffle in combination of the disk shaped baffles provides a method to maintain a more stable convection current within the major portion including the substrate, resulting in a substantially uniform temperature profile across the substrate body along the vertical direction. Especially for substrate containing photovoltaic thin film stack with a physical size as large as several tens of centimeters to 1 meter or bigger, temperature uniformity across the substrate is very important during the reactive thermal treatment process for fabricating high quality thin film solar module. In an alternative embodiment, the cold body associated with the end cover within the minor portion of the furnace tube can serve as a absorption plate for some unwanted solid phase particles or reaction residues, helping to reduce substantially the contamination of the thin film stack on the substrate and further enhance the photovoltaic efficiency of the thin film solar cell.

Figure 8:
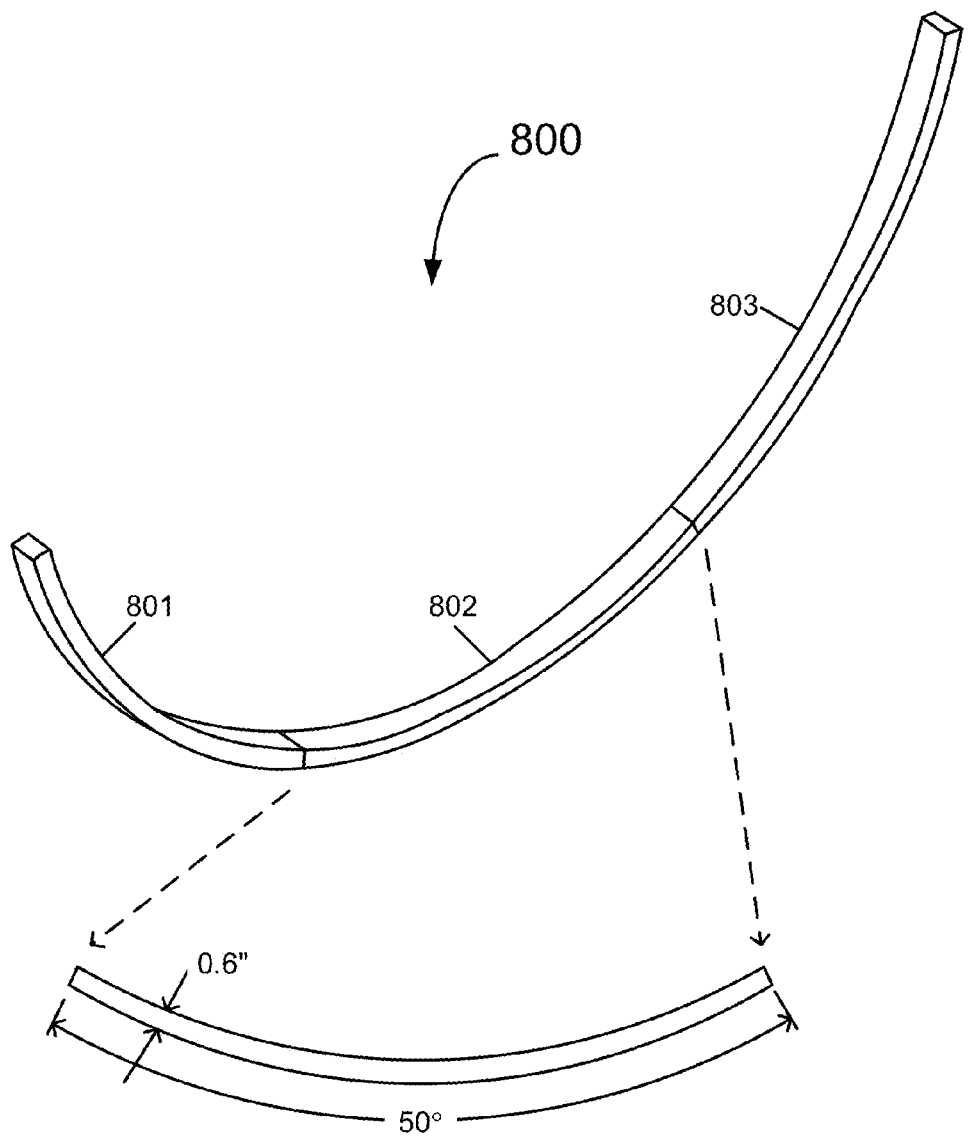
FIG. 8 is a simplified diagram of a crescent shaped baffle being an assembly of three chord segments according to an embodiment of the present invention.

FIG. 8 is a simplified diagram of a crescent shaped baffle being an assembly of three chord segments according to an embodiment of the present invention. This diagram is merely an example, and should not unduly limit the claims herein. One skilled in the art would recognize other variations, modifications, and alternatives. In an embodiment, the crescent shaped baffle can be assembled from two or more segments for reducing complexity in manufacturing and maintenance of the furnace system. As shown, a crescent shaped baffle 800 is an assembly of three segments, 801, 802, and 803 end-to-end tied together. In a specific embodiment, the furnace tube has a circular inner cross section. The crescent shaped baffle 800 is configured to be disposed along a cross section plane and should be shaped to seamlessly fill the curvature of the circular inner wall. Accordingly, each segment 801 or 802, or 803 is a chord characterized by an arc angle, and a dimension in a radial direction, and a dimension in an axial (of the furnace tube) direction. For example, the arc angle for each chord is about 50 degrees. As three 50-degree chords are coupled together, the crescent shaped baffle has a total subtended angle of 150 degree. In an embodiment, the dimension of the chord in the radial direction is substantially the height of the crescent shaped baffle through the whole curved length and the dimension of the chord in the axial direction is the width of the crescent shaped baffle, as seen in FIGS. 4 and 8. In an example, the dimension in the radial direction is 0.6 inches and the dimension in the axial direction is 1 inch. As described in the earlier sections of the specification, the crescent shaped baffle 800 is disposed to the lower portion of the circular inner wall of a furnace tube to block a section of peripheral gap between a disk baffle and the circular inner wall. In particular, the crescent shaped baffle is configured to be in contact with a disk member and has a dimension in radial direction at least greater than the peripheral gap. Therefore, the crescent shaped baffle, as assembled from three 50-degree chords, can block gas flowing through a 150-degree section of the peripheral gap off the lower portion of the circular inner wall. The same crescent shaped baffle also leaves a 210-degree section of the peripheral gap off the upper portion of the circular inner wall. This configuration effectively allows some residue particles in the work gas to leak through the upper portion of the peripheral gap and be absorbed by cold surface of the furnace tube cover member, but prevents cooled gas from returning to the substrate from the lower portion of the peripheral gap. Thus, a reactive thermal treatment process can performed with an improved substrate temperature uniformity and much reduced particle contamination.

While the present invention has been described using specific embodiments, it should be understood that various changes, modifications, and variations to the method utilized in the present invention may be effected without departing from the spirit and scope of the present invention as defined in the appended claims. For example, the tubular shaped furnace is illustrated as an example. Other shaped furnace structure that is configured to perform thermal treatment of a plurality of substrates loaded in vertical orientation can be applied by the present invention to use baffle structure to control internal convection. In addition to use planar baffle to form passes for upper/lower flow, a shaped baffle specifically for altering the lower flow (with lower temperature) is inserted to achieve desired convection adjustment that leads to a much uniform temperature profile across the large scale substrate for thin film photovoltaic devices. Additionally, although the above embodiments described have been applied to reactive thermal treatment for forming CIS and/or CIGS photovoltaic film stack on the substrate, other thin film based thermal processes certainly can also be benefited from the embodiments, without departing from the invention described by the claims herein. Depending on the embodiment, the present method can also be applied to silicon based photovoltaic devices. One of ordinary skill in the art would recognize other variations, modifications, and alternatives.

What is claimed is:

1. An apparatus for reactive thermal treatment of thin film photovoltaic devices, the apparatus comprising:
   a furnace tube including an inner wall extended from a first end to a second end;
   a gas supply device coupled to the second end and configured to fill one or more working gases into the furnace tube;
   a cover configured to seal the furnace tube at the first end and serve as a heat sink for the one or more working gases;
   a fixture mechanically attached to the cover, the fixture being configured to load an array of substrates into the furnace tube as the cover seals the furnace tube; and
   a shaped baffle member disposed seamlessly at a lower portion of the inner wall for blocking a convection current of the one or more working gases cooled by the cover.

2. The apparatus of claim 1 further comprising a heater disposed outside to heat the furnace tube using thermal radiation.

3. The apparatus of claim 2 wherein the furnace tube comprises quartz material at least semitransparent to the thermal radiation.

4. The apparatus of claim 2 wherein the thermal radiation can heat the array of substrates and the one or more working gases, resulting in a temperature profile associated with the array of substrates.

5. The apparatus of claim 4 wherein the temperature profile does not vary more than 20° C. for the array of substrates each having a size of 20×20 cm.

6. The apparatus of claim 4 wherein the shaped baffle is configured as a crescent shaped baffle member, the crescent shaped baffle member restricts a convection current of the one or more working gases being heated substantially within a spatial region between the crescent shaped baffle member and the second end.

7. The apparatus of claim 6 wherein the cover comprises a surface capable of absorbing solid-phase residue particles mixed with the one or more working gases flowing above the crescent shaped baffle member from the spatial region.

8. An apparatus for uniform thermal treatment of thin film devices, the apparatus comprising:

a furnace tube including a circular inner wall extended along an axial direction in horizontal direction from a first end region to a second end region;

a gas supply device coupled to the second end region for filling a work gas into the furnace tube;

a cover member configured to seal the furnace tube at the first end region;

a rack fixture mechanically attached to the cover member, the fixture being configured to load a plurality of substrates into the furnace tube as the cover member seals the furnace tube;

a heater surrounded the furnace tube to provide thermal radiation from outside to heat the work gas; and a baffle member disposed at a lower portion of the circular inner wall.

9. The apparatus of claim 8 wherein the furnace tube comprises a quartz material having a circular internal cross section and being at least semitransparent to the thermal radiation.

10. The apparatus of claim 9 wherein the rack fixture comprises one or more disk members separating the cover member and the array of substrates, each disk member being configured to have a circular shape covering major portion of the internal cross section except a peripheral gap off the circular inner wall.

11. The apparatus of claim 10 wherein the peripheral gap has a dimension smaller than 0.6 inches in radial direction.

12. The apparatus of claim 10 wherein the baffle member comprises two or more segments end-to-end coupled together to form a crescent shaped assembly with a dimension in radial direction that is at least greater than the peripheral gap.

13. The apparatus of claim 12 wherein each segment comprises a chord having a subtended angle to provide a total angle of 150 degrees or greater for the crescent shaped assembly.

14. The apparatus of claim 13 wherein the baffle member is configured to be in contact with at least one of the one or more disk members to use the crescent shaped assembly for substantially blocking a 150-degree section of the peripheral gap off the lower portion of the circular inner wall.

15. The apparatus of claim 13 wherein the cover member comprises an internal cooling structure configured to provide a cold surface capable of cooling a current of the work gas flowing from a 210-degree section of the peripheral gap of the upper portion of the circular inner wall to the first end region and absorbing residue particles in the work gas.

16. The apparatus of claim 15 wherein the baffle member is configured substantially preventing the cooled current of the work gas to return from the first end region to the plurality of substrates for maintaining a temperature variation no more than 20° C. for each of the plurality of substrates across an area of 20×20 cm.

* * * * *